United States Patent
MacKenzie

(10) Patent No.: US 9,525,152 B2
(45) Date of Patent: Dec. 20, 2016

(54) PERMEABLE ELECTRODES FOR HIGH PERFORMANCE ORGANIC ELECTRONIC DEVICES

(75) Inventor: John Devin MacKenzie, Lafayette, CA (US)

(73) Assignee: Sumitomo Chemical Company Limited, Tokyo (JP)

( * ) Notice: Subject to any disclaimer, the term of this patent is extended or adjusted under 35 U.S.C. 154(b) by 236 days.

(21) Appl. No.: 14/233,017

(22) PCT Filed: Aug. 27, 2012

(86) PCT No.: PCT/US2012/052555
§ 371 (c)(1),
(2), (4) Date: Mar. 20, 2014

(87) PCT Pub. No.: WO2013/033035
PCT Pub. Date: Mar. 7, 2013

(65) Prior Publication Data
US 2014/0225093 A1  Aug. 14, 2014

Related U.S. Application Data

(60) Provisional application No. 61/527,740, filed on Aug. 26, 2011.

(51) Int. Cl.
*H01L 51/52* (2006.01)
*H01L 51/44* (2006.01)
*H01L 51/10* (2006.01)

(52) U.S. Cl.
CPC ......... *H01L 51/5203* (2013.01); *H01L 51/102* (2013.01); *H01L 51/441* (2013.01);
(Continued)

(58) Field of Classification Search
None
See application file for complete search history.

(56) References Cited

U.S. PATENT DOCUMENTS

| 4,539,507 A | 9/1985 | VanSlyke |
| 4,665,342 A | 5/1987 | Topp |

(Continued)

FOREIGN PATENT DOCUMENTS

| JP | 8-008065 | 1/1996 |
| JP | 2006-338946 | 12/2006 |

(Continued)

OTHER PUBLICATIONS

Holt, et al., "Fast Mass Transport Through Sub-2-Nanometer Carbon Nanotubes", Science, vol. 312, (2006), pp. 1034-1037.

(Continued)

*Primary Examiner* — Ashok Patel
(74) *Attorney, Agent, or Firm* — Wolf, Greenfield & Sacks, P.C.

(57) ABSTRACT

Improved electrode types and device configurations for organic electronic devices are disclosed. This improvement can be achieved by facilitating gettering or desiccating action of impurities, such as water, oxygen or residual solvents from the active layers of the device. Device structure and device layer materials can contribute to this improved gettering, which is inherently useful in printed electrode devices, but may also be useful in devices with electrodes patterned by other techniques. Improvement in impurity flow out of the active area of the device leads to improved performance and operational lifetime for as-made and encapsulated devices throughout their product lifecycle. Aspects of the present invention enables improved thin film electronic devices, such as OLEDs, organic photovoltaics (OPVs) and the like.

15 Claims, 5 Drawing Sheets

(52) U.S. Cl.
CPC ...... *H01L 51/5221* (2013.01); *H01L 51/5259* (2013.01); *H01L 51/448* (2013.01); *H01L 2251/308* (2013.01)

(56) References Cited

U.S. PATENT DOCUMENTS

| | | |
|---|---|---|
| 4,885,211 A | 12/1989 | Tang |
| 5,247,190 A | 9/1993 | Friend |
| 5,408,109 A | 4/1995 | Heeger |
| 5,682,043 A | 10/1997 | Pei |
| 5,895,717 A | 4/1999 | Cao |
| 5,965,281 A | 10/1999 | Cao |
| 6,284,435 B1 | 9/2001 | Cao |
| 6,372,154 B1 | 4/2002 | Li |
| 6,522,067 B1 | 2/2003 | Graff et al. |
| 6,605,483 B2 | 8/2003 | Victor |
| 7,115,216 B2 | 10/2006 | Carter |
| 2003/0143423 A1* | 7/2003 | McCormick ........ H01L 51/5237 428/690 |
| 2004/0164669 A1* | 8/2004 | Kawaguchi ........... H01L 27/322 313/501 |
| 2005/0123751 A1 | 6/2005 | Tsutsui et al. |
| 2007/0188086 A1 | 8/2007 | Choong et al. |
| 2008/0106191 A1* | 5/2008 | Kawase ............. H01L 27/3225 313/504 |
| 2009/0208733 A1 | 8/2009 | Lee et al. |
| 2009/0246896 A1 | 10/2009 | Kreger et al. |
| 2012/0211739 A1 | 8/2012 | Koyama et al. |

FOREIGN PATENT DOCUMENTS

| | | | |
|---|---|---|---|
| JP | 2009-123362 | * | 6/2009 |
| JP | 2010-238479 | * | 10/2010 |
| WO | 2007/127870 | | 11/2007 |
| WO | 2007-127870 | | 11/2007 |
| WO | 2010/113727 | | 10/2010 |
| WO | 2010/141493 | | 12/2010 |
| WO | 2010/141519 | | 12/2010 |
| WO | 2011/052468 | | 5/2011 |

OTHER PUBLICATIONS

Majumder, et al., "Enhanced Flow in Carbon Nanotubes", Nature, vol. 438, Nov. 3, 2005, pp. 44-45.
Pei, et al., "Polymer Light-Emitting Electrochemical Cells: In Situ Formation of a Light Emitting p-n Junction", J. Am. Chem. Soc., vol. 118, (1996), pp. 3922-3929.
Pei, et al., "Polymer Light-Emitting Electrochemical Cells", Science, vol. 269, (Aug. 25, 1995), pp. 1086-1088.
Zenith Transmission Diffusers, product information sheet, pp. 1-3, Pro-Lite Technology 2012.

* cited by examiner

Denotes ingress paths for moisture, oxygen, etc. into device

Diffusion paths through printed, Ag particle-based, porous cathode

Area under getter

PERMEABLE ELECTRODES FOR HIGH PERFORMANCE ORGANIC ELECTRONIC DEVICES

CROSS-REFERENCE TO RELATED APPLICATION

This application is a national stage filing under 35 U.S.C. §371 of international PCT application, PCT/US2012/052555, filed Aug. 27, 2012, which claims priority to U.S. Provisional Application Ser. No. 61/527,740, filed Aug. 26, 2011, entitled "Permeable Cathodes for High Performance OLED Devices", the entirety of which is incorporated herein by reference.

FIELD OF THE INVENTION

This invention relates to use of permeable electrodes for facilitating outflow of materials from the active layer of an electronic device for improved performance of the electronic device.

BACKGROUND

Various organic electronic devices, including light emitting devices, have been known in the art over the years. For example, U.S. Pat. No. 5,682,043 discloses an embodiment of an organic light emitting electrochemical cell (OLEC)-type device, OLECs typically require low operating voltage and may be suitable for stable and potentially low cost organic light emitting devices. The stability may be related to the fact that the electrochemical doping used in OLECs facilitates charge injection barrier narrowing and reduces the need for low work function metals for charge injection into active layer organic semiconductors. Low work function metals are inherently unstable to corrosion from water or oxygen. This inherent instability can lead to shortened operational lifetimes due to electrode degradation caused by ingress of water from the environment into device packages and potential reaction with the electrode metal. OLECs can achieve low voltage charge injection by using more stable, higher work function metals such as Ag, Al, Ni, or Au, which are more immune to oxidation and/or by using conducting oxides that do not interfere as significantly with charge transport. In their normal form, the active layers of OLECs, such as those described in U.S. Pat. No. 5,682,043, are deposited from a single solution containing light emitting and charge transporting conjugated polymers, for example polyphenylene vinylene polymers, polythiophene-based polymers or polyfluorene-based polymers, in combination with an electrolyte system which typically includes mobile ionic dopants, for example Li triflate (trifluoro methanesulfonate) along with electrolyte forming materials such as polyethylene oxide or similar. Low voltage charge injection in these devices, and relatively high quantum efficiency under bias, is generally attributed to the electric field driven redistribution of electrolyte ions at the cathode and anode interfaces of the OLEC with its adjacent electrode. The ionic dopant redistribution serves to electrochemically dope the conjugated semiconductor active layer materials near the interfaces, leading to narrowing of the injection barriers between the electrode work functions and the molecular energy levels in the active layer semiconductors. This effectively lowers the required bias to inject electrons and holes into the active layer leading to lower voltage electroluminescence in the device when significant and relatively balanced electron and hole currents recombine at luminescent sites in the active layer.

Conventional organic light emitting diodes (e.g., the device shown in U.S. Pat. No. 4,539,507) rely on near-ohmic matching of the work function of the electrodes and the energy levels within the active layers of the device. These devices are often composed of multiple layers of organic semiconductor-based materials with different energy levels. In contrast to that, OLECs have the advantage that charge injection at low bias can be achieved from metals that are less well-matched in terms of work function than what conventional OLEDs require. Of particular interest is the elimination of the need for low work function cathode materials in OLECs at the electron-injecting interface. Low work-function cathode metals, such as Ca, Li, Cs, Ba, and Mg, which are commonly used in conventional devices, including polymer OLEDs (e.g., devices described in U.S. Pat. No. 5,247,190), are typically unstable to oxidation or other degradation mechanisms, particularly in the presence of moisture or oxygen. This warrants restrictions on the processing environments required for devices containing these materials. Similarly, use of low work-function metals necessitates higher encapsulation requirements and/or shorter storage lifetimes because impurities like water or oxygen leaking into the device can lead to spontaneous cathode degradation. For reference, an interested reader may review U.S. Pat. No. 6,522,067.

To date, most OLEC devices have been prepared using conventional deposition approaches, such as spin coating of active layers and vacuum evaporation of thin film cathodes, which are similar to the processes used in preparing conventional reactive cathode OLEDs. These methods include evaporation of metals, such as Al and Ag, to form continuous, specular and relatively impermeable cathodes adjacent to the active layers of the devices.

Recently, increasing attention has been given to printing and coating based approaches for the fabrication of semiconductor thin film devices in general, and, in particular, for the fabrication of organic semiconductor thin films devices. Printing and coating-based manufacturing approaches allow lower cost, higher volume production of device over larger areas and on flexible substrates. Controlling doping parameters is particularly pivotal in the manufacturing of light emitting organic devices as it allows for the use of printable, air-stable, and air-processable cathode materials. Examples of such a device can be found in U.S. Pat. No. 6,605,483.

To realize a practically useful device, it is necessary to prevent impurity (e.g., water and oxygen) ingress into the device during the storage and product lifetime, as oxidation of device materials can severely affect device performance and limit device lifetime. This applies even in the case of OLECs that do not use low work function, reactive cathodes, as light emitting polymers, small molecules, conjugate charge transport materials and other active materials are still prone to oxidative degradation, particularly in the excited state, i.e. when the device is energized and polaronic or excitonic species are present in the active materials. These excited states lower the barrier to reaction, and/or increase the oxidation rate. High excited state densities can also occur when devices are exposed to light or heat, such as in case of photovoltaic cells, photodiodes or other similar sensors. Furthermore, high concentrations of moisture, oxygen or other detrimental species may exist inside a device as manufactured, possibly due to residual impurities in starting materials or impurities absorbed into the device during its manufacture. In conventional OLED devices, devices are typically fabricated on glass substrates, which are rigid and have low water and oxygen permeability. As mentioned previously, the active layer of the device is locally covered by a vacuum evaporated contact, thereby sandwiching the active layer materials between low permeability glass and metal. Devices are typically edge-sealed with epoxies to a backside (assuming bottom emission) encapsulation metal can or glass sheet forming a fully-encapsulated package. In order to control the moisture levels within the package during storage or product lifetime, a relatively small (compared to the total device or package area) getter or desiccant patch may be placed on the encapsulation can or sheet. In some cases, desiccant may be dispensed inside the edge seal perimeter area.

Considering the low aspect ratio of these OLED device structures (assuming the active device as separate from its packaging), there is usually a very restricted route for water, moisture and/or solvents in or out of the completed device active layers. For example, the routes may be via relatively small area edges of the device. Devices are typically tens of microns or more in lateral extent and not thick either. For certain lighting or photovoltaic devices, the lateral dimensions expand to centimeters while the thickness remains in the 100 nm range. These general dimensions mean that moisture from starting materials or processing that is trapped in this conventional OLED layer between the low permeability glass and metal (e.g. as disclosed in co-pending co-owned International patent application no. WO2010/141519, titled, "Encapsulation Process and Structure for Electronic Devices") cannot easily diffuse to the getter and be absorbed. This prevents establishment of a gradient of moisture (or other impurity) between the device and getter, thus preventing lowering moisture concentration of the active device layers by the getter. This is particularly important for printed devices (e.g., as disclosed in co-pending co-owned International patent application no. WO2010/141493, titled, "Formulations for Improved Electrodes for Electronic Devices"), where low solids, load inks, solvents and layers may contain significant amounts of residual water. Solid loading of typical organic semiconductor inks may be a significant factor, as in extreme cases, it is possible to have as high as 100% amplification factor in impurity concentration upon drying.

Getters may also include solvent getters (activated carbon, zeolite, etc.) which can remove residual solvent and allow for lower drying temperatures and drying times and a latent drying effect. A latent effect means removal of solvents after the device was fabricated. This can provide manufacturing advantages as solvent drying is often a rate limiting step in manufacturing depending on the time and oven size required for long drying periods in high throughput process lines. Inclusion of solvent getters can lower extended solvent annealing times that is otherwise needed, and can reduce overall manufacturing time, reduce process line footprint and lower costs (due to reduced oven size) and drying bottlenecks.

Flexible OLEDs, PVs, TFT arrays, and sensors add a new encapsulation challenge. Plastic substrates are attractive options for substrate and/or encapsulation films. To reach reasonable barrier properties for most organic electronics devices, $10^{-2}$ g/m$^2$/day or less water vapor leakage rates are required to prevent damaging moisture levels due to ingress within typical product lifetimes. This number may vary depending on particular device configurations. For example, typical leakage rates are $10^{-3}$ g/m$^2$/day to $10^{-5}$ g/m$^2$/day for certain OLEDs manufactured by the company formerly known as Add-Vision, which was based in Scotts Valley, Calif.; and, $10^{-6}$ g/m$^2$/day for reactive cathode OLEDs for devices made by Philips, Vitex etc. Bare plastics are not able to achieve these levels and barrier films are required to achieve acceptable transparent barrier substrates or encapsulation films. Typically, these substrates include layer or multilayer sets of inorganic oxide or nitride films. Theoretically, barrier properties of even very thin oxide films can be very high. As a practical matter, the main leakage path in thin transparent barrier films is through small localized defects and pinholes in the film. This is particularly damaging for conventional reactive cathode OLEDs as these local leakage points can cause local cathode corrosion and EL emission dark spots even if they overall average area leakage rate is below a specified acceptable level. This could also be an issue for some moisture or oxygen reactive injection layer or emitters, such as some organo-metallic phosphors, which may spontaneously react with moisture or oxygen.

In printed, stable cathode devices such as OLEDs manufactured by former Add-Vision (in Scotts Valley, Calif.) utilizing non-reactive emitters, spontaneous oxidation of cathodes in storage is usually not a major issue. However, the use of a non-permeable cathode, such as a typical continuous evaporated metal, would prevent diffusion of moisture and oxygen to the getter and may result in local buildup of high levels of moisture or oxygen in the active layer of the device.

Further, a preferred method for a fully flexible encapsulated device is to produce a voidless conformal structure (e.g. devices described by International Application No. WO2010/141519) for mechanical stability and dimensional stability under flexing. In this case, mobility of species within the package is reduced by the fact that all materials between the front and back encapsulation surfaces are filled with adhesive or other material (i.e. substantially no voids). Diffusion through these materials is slow. In this case it is advantageous to place the getter immediately behind the OLED (either by printing, placing or laminating the getter immediately behind the OLED or on the encapsulation surface immediately opposite the OLED). Further, to maintain OLED EL, voltage rise and aging uniformity, it is advantageous to have a one-to-one correspondence between OLED active area and getter area. It is therefore advantageous to have a thin, patterned getter such as a screen printable getter formulations, such as SAES Getter Drypaste getter inks, which can be arbitrarily patterned to thicknesses ca. 10 microns-100 microns or thicker with repeated printing.

Even in the case where water may ingress through the barrier immediately adjacent to the device and interact with the device, a permeable cathode allows for diffusive access to the getter/desiccant. If the free energy of the impurity in the getter (or equilibrium partial pressure over the getter) is lower than the free energy of the situation where the impurity is in the OLED, in some cases the impurity/OLED interaction can be reversibly overcome and the impurity effectively gettered. This is facilitated with a permeable cathode that allows rapid diffusion due to improved access by the impurities and diffusion towards the getter. Impermeable getters can represent a diffusion barrier. It is also conceived that the electric fields contribute to charged impurity motion and so drift effects may also be enhanced with permeable cathodes.

SUMMARY

The present invention discloses improved electrode types and device configurations for organic electronic devices.

This improvement can be achieved by facilitating gettering or desiccating action of impurities, such as water, oxygen, and other possible organic/inorganic unwanted residual materials from the active layers of the device. Device structure and device layer materials can contribute to improved gettering, which is inherently useful in printed electrode devices, but may also be useful in devices with electrodes patterned by other techniques. Improvement in impurity flow out of the active area of the device leads to improved performance and operational lifetime for as-made and encapsulated devices throughout their product lifecycle. Aspects of the present invention enable improved thin film electronic devices, such as OLEDs, organic photovoltaics (OPVs) and the like. Aspects of the present invention may be advantageous for flexible, transparent barrier substrate encapsulated devices where substrate barrier leakage is a significant factor. The invention can be useful for reactive cathode devices such as conventional OLED structures as well as high work function electrode devices such as light emitting electrochemical cells.

In an embodiment of the invention, an electronic device is disclosed, comprising an active layer, and, a permeable electrode in contact with the active layer, wherein the permeable electrode allows flow of impurities away from the active layer. The active layer may be a single layer or a plurality of sub-layers. The electronic device may further comprise a getter layer, and, a semi-permeable electrode, on which the active layer is disposed, such that impurities entering the electronic device from the bottom of the device diffuse through the permeable electrode towards the getter layer.

The permeable electrode may be formed by a multitude of ways, such that high-diffusivity porous pathways are enabled through the electrode.

In certain embodiments, a third electrode may be incorporated in the electronic device such that the third electrode helps in driving the impurities towards the getter material.

These and other embodiments and aspects of the present invention would be apparent to persons skilled in the art in view of the detailed description and the enclosed drawings. Moreover, persons skilled in the art will understand that though most of the example device embodiments describe a permeable cathode, with certain modifications within the scope of the invention, any permeable electrode (cathode or anode) or other functional layer may be accommodated within the device. Additionally, the degree of permeability may vary depending on the desired performance.

DETAILED DESCRIPTION

Figure 1:
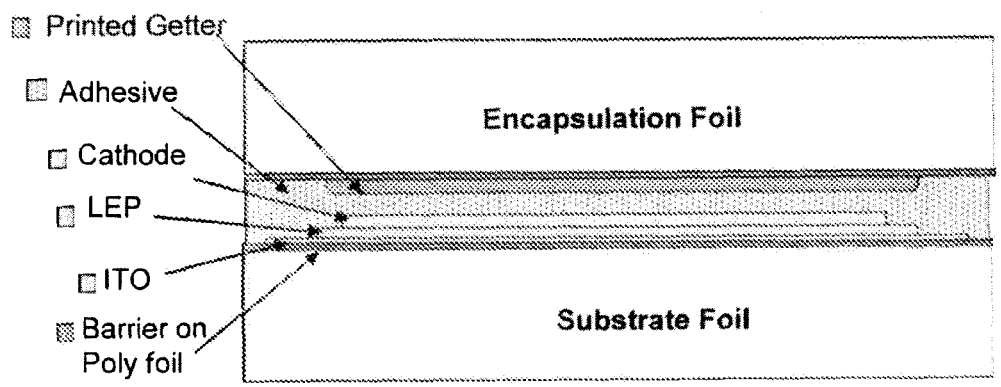
FIG. 1 illustrates schematic cross-section of a printed OLED device on a transparent bottom flexible substrate with a thin adhesive layer separating the OLED device from the getter layer.

Use of a permeable or porous cathode can be advantageous in a device, because a close proximity getter can effectively communicate with the active area of the device through the cathode to remove impurities, such as undesired moisture (water) in the active area. Examples of impurities include water ingressing from the front side of the device, water trapped in the device from manufacture or starting materials, etc. Examples of devices susceptible to impurity ingress include, devices using defect-containing flexible barrier substrates, such as reactive cathode OLEDs on flex, LEC-type printed OLEDs and the like. Manufacturing-induced impurity entrapment may be particularly relevant for encapsulated devices, where it is important to reduce device processing time. Instead of extended temperature, vacuum or radiative treatment to remove residual moisture, oxygen, solvent or other impurities from the active layers of a device where a significant diffusion path to the gettering species is through an impermeable electrode, use of a permeable electrode can enhance overall gettering efficacy, including solvent gettering.

A first example of a permeable electrode comprises particle based printed or solution-deposited electrodes with binders and or voids between particles with a high permeability to impurities, such that impurities can diffuse through those voids towards the getter. Electrode materials may include micron-scale (typically 1-10 microns) particle sizes as well as sub-micron scale particles. Possible matrix materials include polymers such as polyesters, vinyls, epoxies or other materials with lower permeabilities to impurities than the conductive particles.

A second example of a permeable electrode comprises printed or solution-derived electrodes materials containing tube like structures, such as carbon nanotubes. It has been shown that carbon nanotubes have a high transport rate within the tubes comprising single molecules. Interested readers may review "Fast Mass Transport Through Sub-2-Nanometer Carbon Nanotubes," by Holt et el., Science 312 (2006) p. 1043.

A third example of a permeable electrode comprises evaporated cathodes with an tailored porous structure. This may include electrodes based on discontinuous growth or island growth. Other examples may include pores or tube features induced in the electrode by templating, embossing, inclusion of spacer particles, particles of high permeability to cause high diffusivity leakage paths through the cathode, etc.

A fourth example of a permeable electrode comprises an electrode based on high impurity diffusivity components, such as conducting polymers like PEDOT:PSS, or interconnected networks of nanowires (e.g. Ag), or conductive carbon or nitride nanotubes, or a combination thereof. The structure enables transport of impurities through the opening in the linear networks. Transport may also be assisted by flow through the nanotubes or hollow nanowires.

A fifth example of a permeable electrode comprises electrodes made from printed or patterned metal grids or meshes with pores or holes regularly throughout the structure such that impurities can pass through these electrodes.

A sixth example of a permeable electrode comprises electrodes formed from polycrystalline materials deposited by sputtering, ablation, particles coating or otherwise, such that there are sufficient inter-granular voids, holes, tubes, defect or high permeability grain boundary areas such that a higher permeability of impurities is achieved through the thickness of the electrode.

Persons skilled in the art would understand the specific examples discussed below are for illustrative purposes only, and other types of permeable electrodes fall within the scope of the present invention.

Note that some printed electrodes are essentially assemblies of 'point contacts' due to the particulate nature of the conducting elements of the electrode. which do not form a continuous planar conductive contact area, but rather forms a distribution of small contact points over an area. In the case of printed particle-based cathode on light emitting electrochemical cells, charge injection from the cathode to underlying layers occurs only at dispersed local points where tunneling distance between cathode particles is small. Current spreading within an electrochemically-doped region underneath the cathode then leads to more homogeneous current distribution, and light emission. This also leads to enhanced device lifetime at a given area-averaged brightness. This combination of current spreading layers, such as an electrochemically doped layer, can be advantageous when combined with porous and/or heterogeneous cathodes, as it can reduce current density non-uniformities and excitation density variations due to the pores and/or non-conducting or injecting areas of the permeable electrodes.

Figure 2:
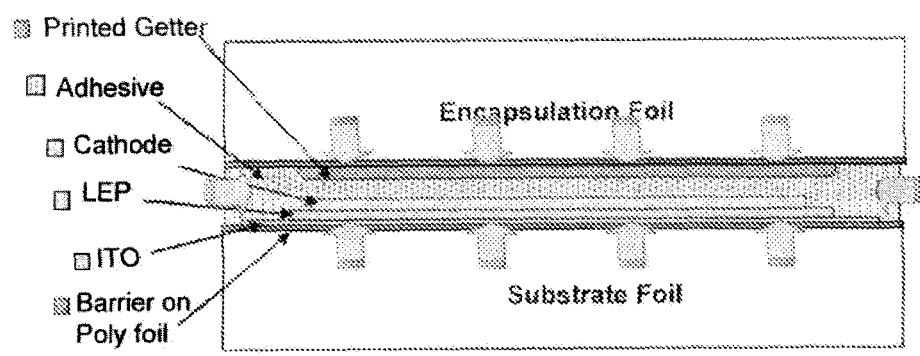
FIG. 2 illustrates ingress of water, oxygen etc. into a planar encapsulated device with finite barrier.

FIG. 1 shows an example encapsulated OLED device configuration according to one aspect of the present invention including a getter in close proximity to the permeable cathode. In this case, impurity levels in the active layer would be reduced by flow of impurities through the cathode where they can diffuse towards a getter behind that cathode. In terms of permeation rates, it is considered that for barrier substrate encapsulated devices, cathode permeation rates higher than the environmental barrier permeation rates would be advantageous. Currently available barrier coated plastic films have water vapor barrier rates in the range of $10^{-3}$ g/m²/day to $10^{-6}$ g/m²/day. For a device such as what is shown in FIG. 1, in which the substrate foil (including in this case the ITO layer which has some barrier effect) has barrier properties of $10^{-4}$ g/m²/day, it would be advantageous to have a cathode permeation rate to water of $>10^{-4}$ g/m²/day. This would account for water entering the active layer from the bottom side of the device (as shown in FIG. 2) and reduce its accumulation in the active layer. In the case of a composite electrode of highly impermeable materials (e.g. Ag particles, Ag mesh, Ag wires) and highly water permeable components, it is advantageous for the permeation rate of those highly permeable components to be relatively higher. For example, for a cathode in a device as described above, which was only 10% by volume of highly permeable material in the cathode, the area permeability rate of the high permeability material would advantageously exceed $10^{-3}$ g/m²/day. It is likely that even higher permeation rates are further advantageous to even more rapidly transport impurities out of the active layers.

While the above rate measurement figures are in area terms, these can be converted to volumetric permeation rates by multiplication by the cathode thickness. For example, for a 10% high permeability content composite cathode that is 4 microns thick, it would be advantageous to have a high permeation rate material.

Referring back to FIG. 1, a cross section of a printed OLED device is shown on a transparent bottom flexible substrate with a thin adhesive layer separating the OLED device from the getter. For relatively thin adhesives (e.g. 100 microns or less, and preferably<+25 microns), diffusion through the cathode is much more rapid via a path through the thickness of the stack (100 microns or less) versus lateral paths orthogonal or less direct, such as would be the case for a device with a non permeable cathode and a getter behind that cathode. Lateral dimensions in some cases might be as large as millimeters or centimeters. Note that the getter here is shown to completely cover the active area of the OLED.

FIG. 2 depicts the water ingress pathways into a conformally-encapsulated OLED device such as what is depicted in FIG. 1. For a generalized, planar encapsulated device with finite barrier and adhesive leakage rates, species such as water and oxygen can ingress from all directions. This is particularly relevant to flexible barrier substrates which can have water leakage rates between $10^{-1}$ g/m²/day to $10^{-6}$ g/m²/day. For larger device areas (such as those of order 10 cm² or larger), the leakage through the barrier film for films with water vapor transmission rate (WVTR) in the range $10^{-4}$ g/m²/day or higher, dominates over edge seal leakage for typical adhesives (100's of g-um/m²-day water permeation rates) at desirable adhesive thicknesses and edge seal widths of order 25 microns and millimeters, respectively. Flexible barrier films are also prone to barrier film defects which can produce locally high water and oxygen leakage, which is laterally isolated. This can lead to black spots due to undesirable localized oxidation or hydrolysis reactions and local cathode degradation and local active layer degradation.

In the structure shown in FIG. 1, if an impermeable cathode is used (such as a continuous evaporated metal electrodes typically used in OLED and OPV, preventing moisture and oxygen from the bottom side of the device from being sequestered in the getter), performance would be degraded. This would be the case where metal can or glass is used as a substrate. A device is deposited on a bottom substrate with an impermeable cathode and encapsulated in such a way that there is a void space immediately behind the device, that may contain a getter somewhere in that space. The getter in that space may act on impurities entering the void space due to edge seal leakage or backside leakage, but the getter in that void cannot communicate with the active area of the device except at the edges.

Figure 3:
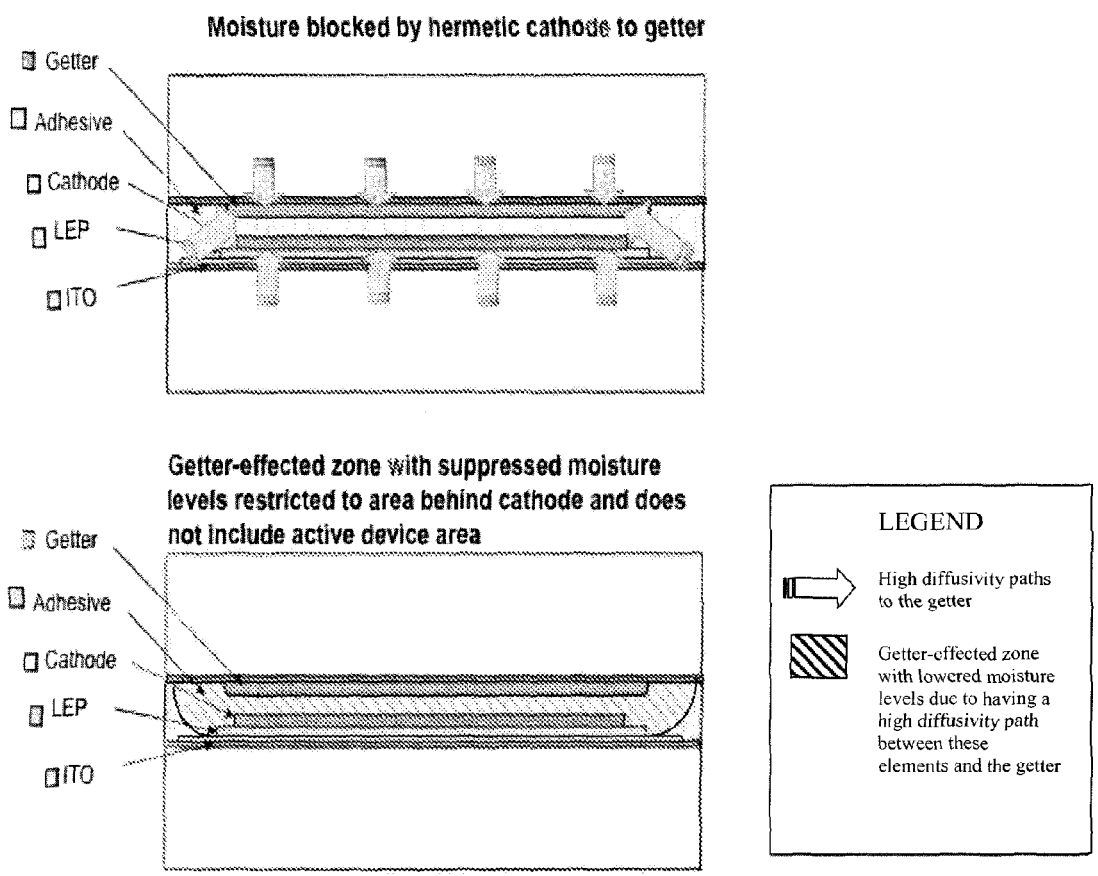
FIG. 3 illustrates a conventional impermeable top electrode configuration for a device.

FIG. 3 depicts the water (and/or oxygen and other impurities) transport pathways to the getter in the case of an impermeable cathode which restricts effective gettering of water or other impurities from regions of the active area away from the edges of the cathode. The top figure of FIG. 3 shows blocking of the short diffusion paths directly between the active area of the device and a getter layer behind the device, leading to trapping of moisture in the active area under an impermeable top electrode. The bottom figure of FIG. 3 shows that the effective getter area is restricted to backside and edge regions of the device package. This is a fundamental flaw in conventional, continuous evaporated metal electrode OLED on flexible substrate devices where there is a damaging amount of bottom substrate leakage.

Figure 4:
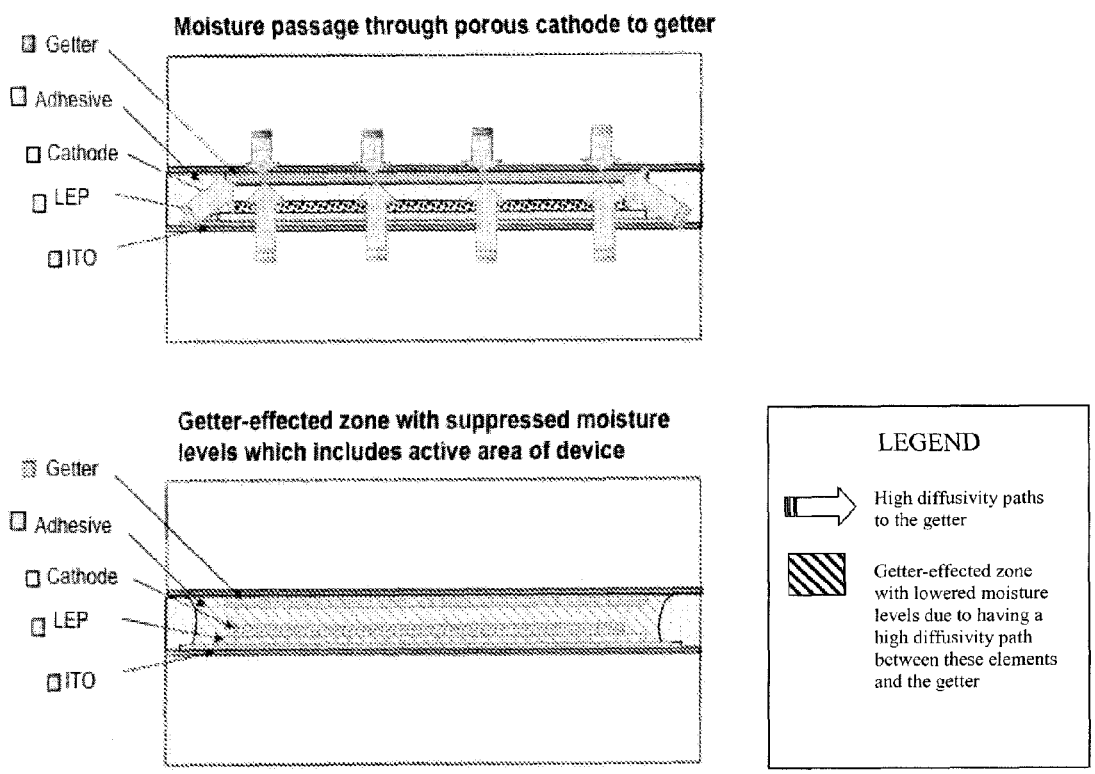
FIG. 4 illustrates a permeable electrode configuration for a device according to embodiments of the present invention.

FIG. 4 shows the case where a high permeability cathode is used and there is rapid transport through the cathode and to the getter. More particularly, the top figure of FIG. 4 shows moisture passage through porous cathode to getter. The bottom figure of FIG. 4 shows the getter-affected zone with suppressed moisture levels. In this case, the getter-effected zone includes the critical active areas of the device. In a structure where porous or high diffusivity materials are used for all device layers, and in particular metal electrodes, and a thin adhesive film which is not impervious to impurity transport, there is a shorter diffusion path to the getter from all sides of the device. This leads to the more effective gettering of impurities that come through or from (such as, with the evolution of hydrogen, radicals, etc. from active layer). Use of getters with a lower vapor pressure of the impurity than would be thermodynamically stable over the electrode materials can sequester these impurities away from the device, even if the impurity comes through the front side of the device. This is of interest for many types of electronic devices but is particularly interesting for devices with relatively stable cathodes (LECs, stable cathode OPV, etc.) where impurity concentration levels in the device are continuously suppressed in the device such that, when the device is excited, photo oxidation or other impurity related degradation is suppressed.

Figure 5:
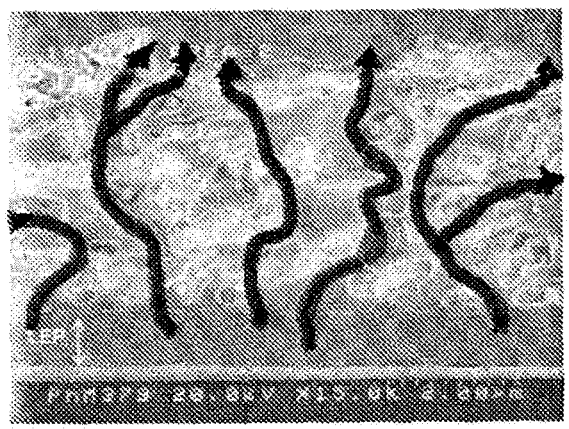
FIG. 5 shows a scanning electron microscope (SEM) image of a cross section of a printed Ag particle-based cathode on an LEC device, schematically indicating the a plurality of diffusion paths.

FIG. 5 shows an actual cross-section of a printed OLED/LEC device with a printed cathode based on Ag particles and a polymer matrix such that there is conductive electrode network interspersed by high permittivity pathways through the device. In the SEM cross-section of a printed Ag particle-based cathode, the bright layer at the bottom of the image, just above the micrograph text and scale bars, is the transparent ITO anode layer. The relatively dark grey layer immediately above that ITO layer is the active layer of a printed LEC and the heterogeneous layer above the LEC layer is the cathode which consists of Ag flakes and organic media. This printed particle cathode has many high diffusivity diffusion paths for water, oxygen or other impurities orthogonal to the plane of the cathode.

Figure 6:
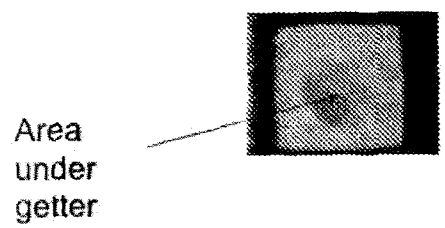
FIG. 6 shows an electroluminescence (EL) image of a polymer OLED/LEC device with a permeable cathode in which a getter was placed in a void that partly covered the active area of the device.

FIG. 6 shows that it is important to consider uniform transport pathways to the getter for permeable electrode devices. Where there are significant differences in access to the getter through the electrode, local differences in device performance and lifetime can result. FIG. 6 depicts an electroluminescence image of a printed OLED device after it has passed its half luminance lifetime (>50% luminance efficiency drop after continuous constant current drive) in which only the small semi-square area in the center of the device had a getter immediately behind it. The configuration of the device follows FIGS. 1-5, but the getter does not cover the entire active area of the device. In this case, the area with a getter immediately behind it was initially lower impedance due to the preferential gettering of water from that region of the device. A high current density flowed into that region due to its lower impedance, causing it to have a higher local excitation density and therefore higher degradation rate than surrounding material not immediately adjacent (more than 25 microns of adhesive thickness away in terms of getter access pathway) to the getter. At or near the end of life of the device, after the impedance has risen and luminance efficiencies have dropped in this center region, current begins to flow to the outer regions of the device and relatively higher luminance levels are achieved. This type of non-uniformity can be avoided by reducing significant differences in effective getter proximity (a figure of merit of diffusivity multiplied by distance may be defined such that the diffusivity multiplied by distance to getter is approximately the same for all active areas of the device.) One means of achieving this in essentially planar devices (as in FIG. 1), is to have a getter which laterally covers the entire device area (and can extend beyond the active area). This can advantageously be achieved with printed getter materials such that the getter can be patterned to correspond to an arbitrary active area layout and thickness can be controlled to deliver the optimal thickness of getter which achieves the desired gettering effect without expensive wastage of material that can occur with die cut preformed and relatively thick getter materials. Thin printed getter materials (<50 micron) have the further advantage of good step coverage and flexibility which can be an issue with thicker preformed getter (often>100 micron).

In the example shown in FIG. 6, lateral device dimensions were 1 cm and the distance between the cathode and getter was ~25 microns and this space was filled with a acrylate polymer adhesive. This device was tested in $N_2$ so the non-uniformity effects depicted here are due to the preferential removal of residual water from the getter-proximate device regions remaining in the device form starting materials or processing, not environmental intrusion. As described above, by end of device life, the luminance efficiency of these areas are preferentially degraded and therefore now have relatively lower quantum efficiency and higher impedance. In this later stage condition, current now flows and luminance is more efficient in areas that were not in close diffusion proximity to the getter. These local burned out areas and the resulting nonuniform EL performance can be avoided by have a getter layer that extends to better cover the active area regions. In this case lateral device dimensions were 1 cm and the distance between the cathode and getter was ~25 microns and this space was filled with an acrylate polymer adhesive.

Figure 7:
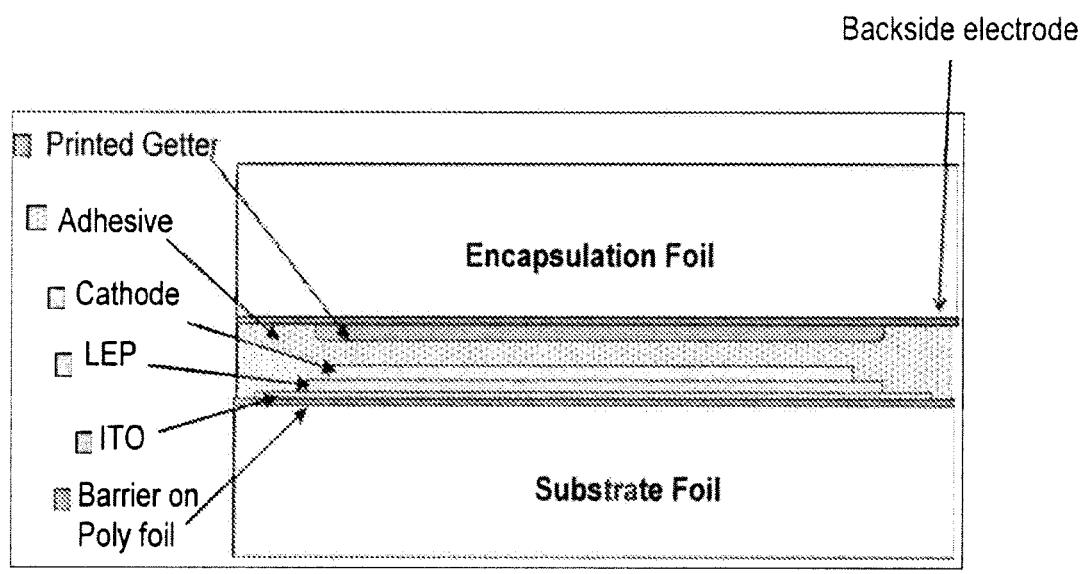
FIG. 7 shows cross section of a three-terminal device with a backside electrode to drive impurities away from the active device area including the area contacting the electrode regions, according to an embodiment of the present invention.

FIG. 7 shows an example OLED-type device structure with a backside electrode which would drive impurities away from the active device and towards a getter. In particular, FIG. 7 shows a three terminal device structure following the form of the construction of FIG. 1, but with a backside electrode to drive impurities away from the active device and active device contacting electrode regions.

It is to be noted that though the above concepts have been exemplified with OLED structures, they are applicable in photovoltaic, sensor and display devices where removal of unwanted impurities from an active area that is contacted by an electrode, is advantageous.

Other possible embodiments include the use of permeable electrode and one or more media between the electrode and the getter that transports impurities anisotropically. This can be used to enhance transport of impurities form the device to the getter while minimizing lateral intrusion of impurities into the device structure. This can be achieved by the use of tubes or pores aligned between the device and the getter.

The inventor has also conceived that a bias driven configuration in which species that diffuse into the top electrode can be driven towards a backside electrode behind the device. This backside electrode does not necessarily participate in the active device operation but merely serves to drive impurities out of the active device layers and/or active device-contacting electrodes. The top electrode of the device could be separated from the backside electrode by a dielectric which restricts electronic current flow but allows impurity flow (for example an acrylate polymer, an ethylene oxide polymer or other ion transport polymer). In this case the total charge current flow to the backside electrode would be relatively small and little electrical power would actually be dissipated. The backside electrode could be shorted to the front side electrode on the bottom substrate or could be maintained at an independent bias. Impurities could include $H_2O$ (via $OH^-$ anions), oxygen radicals, $H^+$, or charged byproducts of active layer decomposition. The ionic state could be created by a high electric field created by a relatively high bias between the device electrode and the backside electrode.

While certain representative embodiments and details have been shown for purposes of illustrating the invention, it will be apparent to those skilled in the art that various changes in the methods and apparatus disclosed herein may be made without departing from the scope of the invention which is defined in the appended claims. Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure. Additionally, the commercial names of materials mentioned in the description are used to facilitate the reader's understanding, without any suggestion that the invention is restricted to only certain device configurations and materials mentioned herein.

The invention claimed is:

1. An electronic device, comprising:
   (a) an active layer;
   (b) a permeable electrode in contact with the active layer, wherein the permeable electrode allows flow of impurities away from the active layer, and wherein the permeable electrode comprises a composite of impermeable and permeable components; a grid or mesh of conducting lines, wires, or filaments; carbon nanotubes; or a polycrystalline material; and
   (c) a getter layer.

2. The electronic device of claim 1, wherein the device is a planar device.

3. The electronic device of claim 1, wherein the device further comprises:
   a semi-permeable electrode, on which the active layer is disposed.

4. The electronic device of claim 3, wherein the device further comprises: a third electrode that serves to drive impurities out of the device.

5. The electronic device of claim 1, wherein the permeable electrode comprises the grid or mesh of conducting lines, wires, or filaments.

6. The electronic device of claim 5, wherein at least some of the conducting lines, wires, or filaments have a plurality of pores along their structure.

7. The electronic device of claim 1, wherein the permeable electrode comprises carbon nanotubes.

8. The electronic device of claim 1, wherein the permeable electrode comprises the composite of impermeable and permeable components, wherein the permeable components form at least one path through the permeable electrode.

9. The electronic device of claim 1, wherein the permeable electrode comprises the polycrystalline material, wherein the polycrystalline material comprises inter-granular voids.

10. The electronic device of claim 1, wherein the device further comprises a barrier substrate, and wherein a permeability of the permeable electrode is equal to or greater than a permeability of the barrier substrate.

11. The electronic device of claim 1, wherein the getter layer completely covers or extends beyond a lateral extent of an active area of the device.

12. The electronic device of claim 1, wherein a region between the permeable electrode and the getter layer has a permeability that is greater than or equal to the permeability of the permeable electrode.

13. The electronic device of claim 12, wherein the region between the permeable electrode and the getter layer comprises a polymer or organic material with high permeability for the impurities in the active layer.

14. The electronic device of claim 1, wherein the permeable electrode has a permeation rate of the impurities of at least about $10^{-3}$ g/m$^2$/day.

15. The electronic device of claim 1, wherein the active layer comprises a plurality of sub-layers.

* * * * *